US 6,602,803 B2

(12) United States Patent
Yew et al.

(10) Patent No.: US 6,602,803 B2
(45) Date of Patent: *Aug. 5, 2003

(54) DIRECT ATTACHMENT SEMICONDUCTOR CHIP TO ORGANIC SUBSTRATE

(75) Inventors: Chee Kiang Yew, Singapore (SG); Masazumi Amagai, Oita (JP)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/401,572

(22) Filed: Sep. 22, 1999

(65) Prior Publication Data
US 2002/0130397 A1 Sep. 19, 2002

(30) Foreign Application Priority Data
Sep. 28, 1998 (SG) .......................... 9803207-1

(51) Int. Cl.[7] .............................. H01L 21/31
(52) U.S. Cl. .................. 438/780; 438/106; 438/798; 438/455
(58) Field of Search ............... 438/455, 106, 438/107, 15, 780, 781, 798

(56) References Cited

U.S. PATENT DOCUMENTS

| | | | | |
|---|---|---|---|---|
| 5,061,509 A | * | 10/1991 | Naito et al. | 427/13 |
| 5,353,498 A | * | 10/1994 | Fillion et al. | 29/840 |
| 5,739,585 A | * | 4/1998 | Akram et al. | 257/698 |
| 5,776,796 A | * | 7/1998 | Distefano et al. | 438/106 |
| 5,981,314 A | * | 11/1999 | Glen et al. | 438/127 |
| 6,218,202 B1 | * | 4/2001 | Yew et al. | 438/15 |
| 6,228,676 B1 | * | 5/2001 | Glenn et al. | 438/107 |
| 6,242,283 B1 | * | 6/2001 | Lo et al. | 438/106 |

OTHER PUBLICATIONS

Wolf, S., Tauber R.N.; Silicon Processing for the VLSI Era vol. 1: Process Technology, Lattice Press, Sunset Beach, CA, 1986, p.p. 547–551.*

* cited by examiner

Primary Examiner—John F. Niebling
Assistant Examiner—Christopher Lattin
(74) Attorney, Agent, or Firm—Michael K. Skrehot; Wade James Brady III; Frederick J. Telecky Jr.

(57) ABSTRACT

A method for attaching an integrated circuit chip to an organic substrate comprising the steps of providing an integrated circuit chip having an active and a passive surface, said active surface including a protective polymer layer; activating said polymer layer by exposing it to reactive ion etching plasma, thereby increasing the surface roughness and imparting affinity to adhesion; providing an electrically insulating substrate having first and second surfaces; and contacting said second surface of said substrate to said activated polymer layer on said chip, whereby strong adhesion is exerted at the interface between said layer and said substrate, directly attaching said substrate to said chip.

19 Claims, 2 Drawing Sheets

DIRECT ATTACHMENT SEMICONDUCTOR CHIP TO ORGANIC SUBSTRATE

The present invention is related in general to the field of semiconductor devices and processes, and more specifically to methods for reliably assembling integrated circuit chips directly onto organic substrates.

BACKGROUND OF THE INVENTION

One of the major trends in semiconductor packaging is the effort to shrink the package outline so that the package consumes less area and less height when it is mounted onto the circuit board. Another powerful trend is the effort to achieve the outline reduction with minimum cost (both material and manufacturing cost). One of the most successful approaches has been the development of so-called "chip-scale packages". These packages have an outline adding less than 20% to the chip area. A chip-scale package which has only the size of the chip itself, is often referred to as "chip-size package".

Within the semiconductor memory product families, one of the most promising concepts for chip-scale packages is the so-called "board-on-chip" design. Recently, several patent applications for this design concept have been submitted, entitled "Chip-Size Integrated Circuit Package" (Serial # 9702348-5 filed in Singapore on Jul. 2, 1997, and Serial # 08/994,627 filed in the U.S. on Dec. 19. 1997), "Thin Chip-Size Integrated Circuit Package and Method of Fabrication" (Serial # 9800005-2 and Serial # 9800006-0 filed in Singapore on Jan. 2, 1998), "Semiconductor Device Testing and Burn-in Methodology" (Serial # 9800617-4, filed in Singapore on Mar. 25, 1998, and Serial # 9800654-7, filed in Singapore on Mar. 28, 1998), "Method of Encapsulating Thin Semiconductor Chip-Scale Packages" (filed in Singapore on Aug. 25, 1998), all assigned to Texas Instruments Incorporated. Progress has been made in reducing the area and height requirements of packages, but frustrating problems still remain in maximizing adhesion, device reliability assurance and manufacturing cost reduction.

The patent disclosure entitled "Apparatus and Method for Direct Silicon Chip Attachment to a Lead Frame" (Serial # 9800171-2 filed in Singapore on Jan. 23, 1998, and Serial # 09/115,160 filed in the U.S. on Jul. 14, 1998), also assigned to Texas Instruments Incorporated, describes a process to fabricate a chip-scale package by attaching a silicon chip to a printed circuit board using a metal layer and an adhesive layer, thus forming a strong attachment. The metal layer may be disposed on the printed circuit board with the adhesive layer disposed between the metal layer and the chip or the metal layer may be disposed on the chip with the adhesive layer disposed between the metal layer and the printed circuit board. Unfortunately, the process of using both and a metal layer and an adhesive layer is expensive.

In the last few years, several publications discussed principal approaches of increasing the adhesion strength. In "Polyimide Surface Characteristics for Adhesion Strength at the Interface between Polyimide and Mold Resin" (Proc. IEEE Singapore IPFA, pp. 6–10, 1993), M. Amagai et al. exposed photosensitive and non-photosensitive polyimides to reactive ion etching plasma and then encapsulated the samples in two types of thermoplastic molding resins. The authors demonstrated the advantage of breaking C—N chemical bonds by the plasma energy, making the polyimide surface very hydrophilic with an increasing density of carbonyl and carboxyl groups. They believed that the polyimide molecules are oriented parallel to the surface and that their free radicals (carbonyl and carboxyl groups) are subsequently oriented perpendicular to the polyimide surface. The results suggested that the interfacial adhesion is due to the chemical bond between the hydrogen of molding resin and the oxygen of the polyimide surface. Furthermore, the authors found that the plasma treatment increases the polyimide surface roughness. Increased contact area improves the interfacial adhesion.

Similar results of adhesion between plasma-exposed polyimide layers and epoxy molding compounds were reported by M. Amagai et al. in "The Effect of Polyimide Surface Morphology and Chemistry on Package Cracking Induced by Interfacial Delamination" (Proc. IEEE International Reliability Physics Symposium, pp. 101–107, 1994). The use of an epoxy molding resin which had enhanced rotational freedom at the molecular level (non-linear molecule) increased the adhesion and prevented interfacial delamination and package cracking.

The knowledge gained was applied to polyimide-to-metal adhesion in "The Effect of Adhesive Surface Chemistry and Morphology on Package Cracking in Tapeless Lead-on-Chip (LOC) Packages" (45th IEEE Electronic Components and Technology Conference, 1995). The LOC package is the dominant package type for centerline-bonded memory devices since the 1 Mbit DRAM; today's 64 and 256 Mbit DRAM are also packaged using the LOC technology. In the so-called "tapeless" modification, a thermoplastic adhesive layer, deposited on the protective passivation layer of the chip surface, has replaced the original double-sided adhesive tape. From the standpoint of cost reduction, this is an improvement, but still not a satisfactory solution. M. Amagai's work focused on the interfacial adhesion strength the epoxy molding compound and the adhesive surface. He found that the strength is primarily determined by the degree of bonding between the hydrogen of the epoxy molding compound and the silicone, oxygen, and fluorine of the adhesive surface. Relatively little attention was given to the adhesion between the metallic leadframe (copper, iron-nickel alloy, etc.) and the adhesive layer.

In modern chip-size packages, the lead-on-chip (LOC) concept has been replaced by the board-on-chip (BOC) concept. Little is known about maximizing the adhesion between the board and the adhesive surface, and no investigation has been performed to maximize adhesion directly between the board and the protective passivation layer of the chip surface. The goal of offering for commercial products a cost-effective, reliable method of manufacturing in high volume and with flexible, low-cost process has remained elusive, until now.

Consequently, an urgent need has arisen for assembling chip-scale semiconductor packages based on simplified, low-cost processes that result in reliable products and at the same time achieve improvements toward the goal of small outline and low profile packages. The method should be flexible enough to be applied for different semiconductor product families and a wide spectrum of design and process variations, and should allow the usage of various formulations of board materials. Preferably, these innovations should be accomplished using the installed equipment base so that no investment in new manufacturing machines is needed.

SUMMARY OF THE INVENTION

The present invention provides a method of assembling a semiconductor device; it especially relates to high density, high speed integrated circuits in packages which have an outline similar to the integrated circuit chip itself, and a low profile. These circuits can be found in many device families such as processors, digital and analog devices, memory and logic devices, high frequency and high power devices, especially in large chip area categories. The invention helps to alleviate the space constraints in continually shrinking applications such as cellular communications, pagers, hard disk drives, laptop computers and medical instrumentation.

In accordance with the present invention, a preactivation method is provided for the protective polymer layer on the surface of integrated circuit chips which imparts adhesiveness to the polymer layer. Furthermore, an electrically insulating substrate is provided, comprising a plurality of conductive routing strips integral with the substrate. This substrate is directly attached to the preactivated polymer layer. The preactivation comprises a plasma exposure of the polymer layer for increasing the surface roughness and creating molecular radicals consisting of chemically unsaturated bonds.

It is an object of the present invention to be applicable to a variety of different semiconductor chip-scale package (CSP) designs, for example: Chip attached directly to board, chip assembled to board with interim metal layer, center-line bonding, peripheral bonding, wire bonding, and flip-chip solder bonding.

Another object of the present invention is to provide a low-cost method and system for assembling chip-scale devices in thin overall profile.

Another object of the present invention is to provide higher production throughput.

Another object of the present invention is to improve product quality by adhesion uniformity, and to enhance reliability assurance by controlling mechanical stress, minimizing moisture absorption, and general in-process control at no extra cost.

Another object of the invention is to introduce assembly concepts for thin profiles which are flexible so that they can be applied to many families of semiconductor products, and are general so that they can be applied to several future generations of products.

Another object of the invention is to minimize the cost of capital investment and the movement of parts and product in the equipment.

These objects have been achieved by the teachings of the invention concerning systems and methods suitable for mass production. Various modifications have been employed for the assembly of semiconductor chips and insulating substrates, as well as interconnection techniques.

In one embodiment of the invention, the method of attaching the chip to the organic substrate includes positioning the substrate in contact with the preactivated polymer layer on the chip. The chip can be mounted on a stage where heat is applied to the chip and the substrate. Also, force may be applied between the chip and the substrate. In one embodiment of the invention, the temperature applied to the chip is between 150 and 350° C. and may preferably be about 200° C. In another embodiment of the invention, the force applied between the chip and the substrate may be between 5 and 7 kg and preferably about 5.5 kg. The force may be applied for between 2 and 10 s and preferably for about 5 s.

In yet another embodiment of the present invention, a metal layer is disposed on the surface of the substrate facing the chip prior to attaching this surface to the preactivated polymer layer on the chip. When heat is applied to the chip and the substrate, the temperature applied may be between 150 and 350° C. and may preferably be about 200° C. When force is applied between the chip and the substrate, the force may be between about 1.5 and 7.0 kg and preferably be about 3 kg. The force may be applied for between 2 and 10 s and preferably for about 5 s.

In another embodiment of the invention, a transfer molding process replaces conventional encapsulation methods, with the process parameters (temperature, time, pressure, transfer, curing, etc.) modified in order to optimize them relative to the system and materials parameters.

In yet another aspect of the invention, benefits are derived from the fast-speed singulation methods (such as sawing) of the assembled and encapsulated devices, and the lower costs of the molding compounds and methods (as compared to potting materials and methods).

The technical advances represented by the invention, as well as the objects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to high frequency, high speed integrated circuit (IC) packages having both a low profile and a small outline. As defined herein, the term "outline" relates to the overall width and length of, for example, the entire IC package. The outline of the IC package is also referred to as the footprint of the IC package, because it defines the surface area on a motherboard that the IC package will occupy. Outline will be measured in, for example, square millimeters. As defined herein, the term "profile" refers to thickness or height of, for example, the IC package. The profile will be measured in, for example, millimeters. As defined herein, the term "substantially the same" refers to the relative outlines of the substrate and the semiconductor chip, which are within less than about 10% of one another. In embodiments where the chip and the substrate have the same outlines, the package is referred to as chip-size package. Importantly, the term substantially the same does not indicate which of the two components is larger, as either form is encompassed by the present invention.

Figure 1:
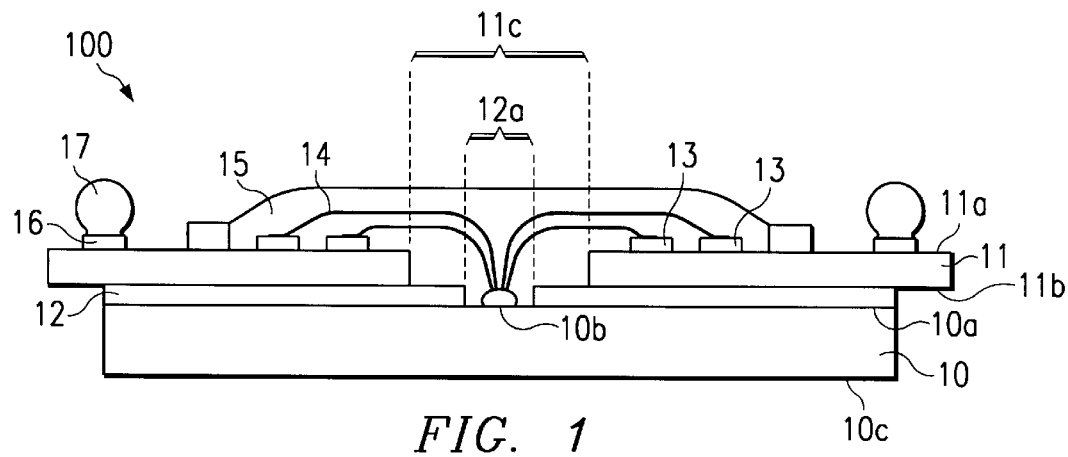
FIG. 1 is a simplified and schematic cross section of a semiconductor chip directly attached to a substrate according to one embodiment of the present invention.

FIG. 1 is a simplified and schematic cross section of a semiconductor chip 10 attached to the second surface 11b of a substrate 11, forming a chip-scale package generally designated 100. Chip 10 has an active surface 10a comprising the integrated circuit and a plurality of bonding pads 10b, and a passive surface 10c. The semiconductor material may be silicon, silicon germanium, gallium arsenide, or any other semiconductor material used in electronic device production. In case of silicon ICs, the thickness of the chip is typically between 225 and 475 μm, and the chips may belong to product families such as dynamic random-access memories (DRAM), synchronous DRAM (SDRAM), static random-access memories (SRAM), erasable programmable read-only memories (EPROM), logic circuits (LOGIC), digital signal processors (DSP), application-specific ICs (ASIC), and many other integrated circuit components.

All of these ICs receive in the wafer fabs a protective passivation overcoat (typically 0.5 to 1.0 μm thick) made of silicon nitride, which is impermeable against moisture penetration (not shown in FIGS. 1 to 4). It is of pivotal importance for the present invention that most of these ICs receive in the wafer fabs an additional layer of polyimide (typically 7 to 15 μm thick) on top of the silicon nitride, designated 12 in FIG. 1. The reason is threefold: The low dielectric constant of polyimide (relative to the dielectric constant of silicon nitride) lowers the capacitance of circuit elements and thus increases their speed; polyimide absorbs alpha radiation particles which are known to produce soft-errors in memory cells; and the organic nature of polyimide helps to mitigate thermomechanical stress in temperature excursions of the device. When these polyimide layers, and layers of related polymer chemistry, are preactivated, they acquire an adhesiveness such that an organic substrate can be directly attached to them.

Figure 2:
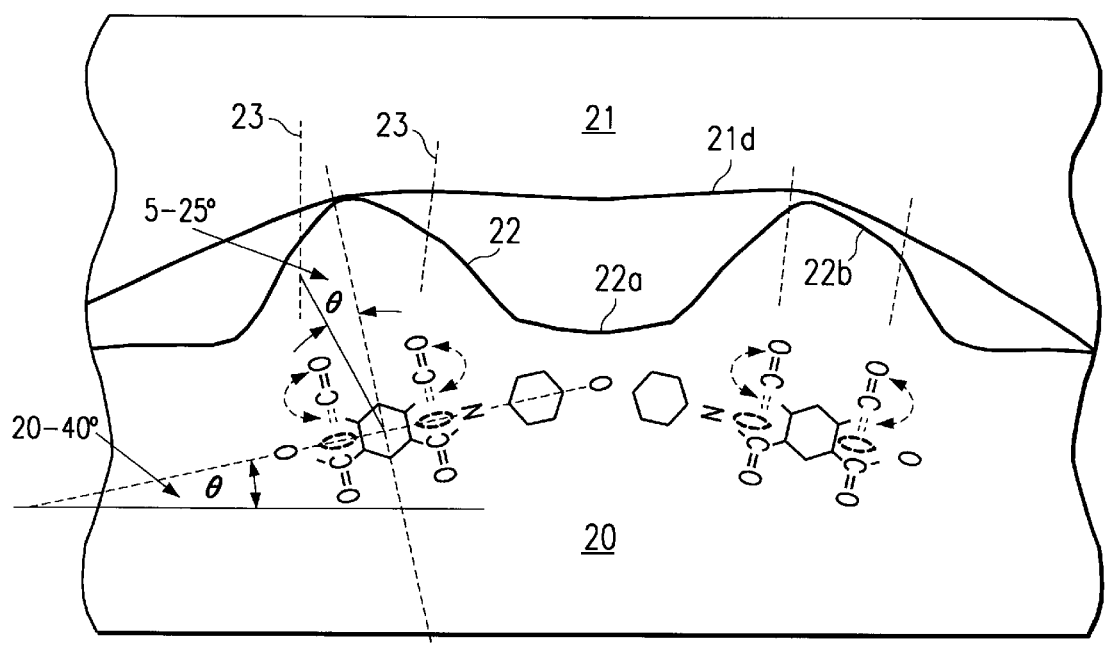
FIG. 2 is a schematic enlarged cross section of a portion of the interface between the polyimide layer attached to the substrate.

In order to achieve the needed preactivation, the polymer layer on the chip is exposed to an ion etching plasma (more detail in conjunction with FIG. 2). In the preferred embodiment, a CF4/O2 plasma is chosen with an energy sufficient to break the C—N bonds of the polyimide which have a binding energy of 69.7 kcal/mol. In comparison to other chemical bonds (such as C—C, 83.1 kcal/mol; C—O, 84.0 kcal/mol; C—H, 98.8 kcal/mol; N—H, 93.4 kcal/mol; C=C, 146.0 kcal/mol; etc.), the C—N bonds have the lowest binding energy and are thus preferably broken by the plasma exposure. As a result, the polyimide surface is rendered very hydrophilic, with an increase in surface roughness and molecular radicals comprising chemically unsaturated bonds, thus imparting to the surface a strong affinity to adhesion. According to the invention, a total microroughness per measured area of more than 0.25% is needed to optimize adhesion. As for the molecular radicals, the plasma needs to generate surface carbonyl and carboxyl groups totaling more than 25% in order to achieve sufficient adhesive strength. Suitable polyimides for obtaining those characteristics are commercially available from Asahi Chemical Corporation, Japan.

FIG. 2 is a schematic enlarged cross section of a small portion of the interface between the polyimide attached to the substrate. In FIG. 2, the polyimide is designated 20 and the substrate 21. FIG. 2 shows the preferred results of the plasma exposure schematically. The polyimide 20 comprises a surface contour 22 which indicates substantial surface roughness consisting of numerous valleys 22a and peaks 22b. The peaks are in intimate contact with surface 21a of substrate 21. At the peaks 22b, the contacts comprise numerous bonds 23. It can be concluded from the method that the polyimide molecules are oriented approximately parallel to the polymer layer surface and that their free radicals (carbonyl and carboxyl groups) are oriented approximately perpendicular to the surface. More specifically, FIG. 2 shows that for best results the molecular chains are oriented ranging from 20 to 40° in the direction of Z against the X-Y plane, and the imide chains (C=O and benzene groups) are oriented ranging from 5 to 25 in the direction of Z against the X-Y plane.

The interfacial adhesion is due, therefore, to the chemical bonds 23 between the oxygen of the polyimide surface and the hydrogen in the case of an organic substrate, or the dipole moment bonding in the case of a metal substrate facing the polymer.

If the substrate (designated 21 in FIG. 2, and 11 in FIG. 1) is an organic material, it comprises, for example, FR-4, which is an epoxy resin, or a cyanate ester resin, reinforced with a woven glass cloth. It is available from Motorola Inc., U.S.A., or from Shinko Corp., Japan, or from Ebinden Corp., Japan. Alternatively, the organic substrate may be FR-5 or a BT resin, available from the same commercial sources. When selecting the material for the substrate, four parameters should be considered, namely thickness, dielectric constant, glass transition temperature, and the coefficient of thermal expansion.

Thickness is dependent on the number of layers required and the amount of reinforcement used in a given layer. The reinforcing glass cloth can range in thickness from, for example, 50 μm per sheet (type 106) to about 200 μm per sheet (type 7628). Dielectric constant is determined by a combination of the resin used and the thickness and type of reinforcement used. Standard FR.-4 has a dielectric constant of about 4.5. This constant can be reduced to about 3.0 by replacing the epoxy resin with a cyanide ester resin. The greater the thickness, however, the greater the problems associated with thickness control, rough surfaces, excessive drill reflection and poor resin refill.

The temperature at which a resin changes from a glass-like state into a "rubbery" state is generally designated as the glass transition temperature Tg. Standard FR-4 is made with a bifunctionally polymerizing epoxy that has a Tg of about 110° C. Higher Tg temperatures may be obtained by using a tetrafunctional epoxy. For higher Tg values, in the range of 150 to 200° C., a cyanate ester/epoxy blend can be used. Additionally, polyimides provide for substrates having a Tg above 250° C.

The coefficient of thermal expansion for FR-4 is about 16 ppm/° C. A difference in the coefficient of thermal expansion between the substrate 11 in FIG. 1 made from FR-4 and the silicon chip 10 can lead to failure of the device shown in FIG. 1 due to thermomechanical stresses during the assembly steps and/or during the use of the device.

In the preferred embodiment of the present invention, the step of contacting the substrate 11 in FIG. 1 to the preactivated polymer layer 12 (or in FIG. 2, substrate 21 to polymer 20, respectively) further includes the step of applying heat to the substrate and the polymer layer on the chip. The preferred range of temperature is between about 150 and 350° C. When selecting the temperature based on the materials chosen, one needs to keep in mind that three more process steps will require elevated temperatures: Forming the electrical connections using whisker wire bonding (for gold ball bonding, typically between 170 to 220° C.), protecting the whisker wires using encapsulation or molding processes and curing of the semiviscous materials (for epoxy-based materials, typically about 175° C.), and assembling the device onto motherboards using solder ball reflow (for commonly used lead/tin alloys, approximately between 190 and 250° C).

In the preferred embodiment of the present invention, the step of contacting the substrate to the preactivated polymer layer further includes the step of applying force between the substrate and the polymer layer. The preferred range of force is between 5 an 7 kg, and the time period of applying force is between 2 and 10 s.

If a metal layer (designated 43 in FIG. 4 and again 21 in FIG. 2) is disposed on the substrate prior to attaching the substrate to the preactivated polymer surface of the chip, the metal is selected from a group consisting of copper, copper alloy, iron-nickel alloy (for instance the so-called Alloy 42), invar, or gold. In this case, the bonds 23 in FIG. 2 comprise dipole moment bonds.

There are various choices for the configuration of the metal layer. In the preferred embodiment shown in FIG. 4, the semiconductor chip 40 comprises on its active surface 40a the polyimide layer 42. Between this polyimide layer 42 and the organic substrate 41 is the metal layer 43 disposed on the substrate. In a preferred embodiment, this metal layer 43 is a copper layer in the thickness range 35 to 125 $\mu$m. The thin metal layer 43 increases the bonding strength of the preactivated polyimide layer 42 and the organic substrate 41. Consequently, the auxiliary process steps used during contacting the substrate 41 to the preactivated polymer layer 42 can be modified. For example, in the preferred embodiment, the step of applying force between the substrate and the polymer layer is reduced to between about 1.5 to 7.0 kg, for a period of time from about 2 to 10 s. The step of applying heat to the substrate and the polymer layer during the contacting process step is preferably in the temperature range between about 150 to 350° C.

The method of the invention to attach a semiconductor chip directly to an organic substrate can be applied to a multitude of device designs with chip-scale and chip-size packages. Referring now to FIG. 1 of a chip-scale device generally designated 100, the semiconductor chip 10 has its plurality of bonding pads 10b arranged along the centerline of the chip. Consequently, the polyimide layer 12 must have windows 12a opened around the bond pads 10b, and the substrate 11 needs an opening 11c. Furthermore, integral to the electrically insulating substrate 11 is a plurality of electrically conductive routing strips (not shown in FIG. 1) and, on the first surface 11a of substrate 11, a plurality of contact pads 13. These contact pads serve as signal, ground and bus contacts. Bonding wires 14 electrically connect the bond pads 10b to the contact pads 13. The bonding wires 14 are protected against damage and environmental influences by encapsulation 15. The materials used for the encapsulation may either be molding compounds (epoxy-based materials use in transfer molding) or potting materials (cyanate ester-type resins, epoxies, polyesters, polyimides, cyanoacrylate, etc.), typically strengthened by inorganic fillers. The encapsulation material also fills the openings 12a and 11c.

A plurality of contact pads 16, disposed on the first surface 11a of substrate 11, serves as metallization to attach solder balls 17 for electrical contact to motherboards. It should be mentioned that the term solder "balls" used herein does not imply that the solder contacts are necessarily spherical; they may have various forms, such as semispherical, half-dome, truncated cone, or generally bump. The exact shape is a function of the deposition technique (such as evaporation, plating, or prefabricated units) and reflow technique (such as infrared or radiant heat), and the material composition. The solder balls are usually small in diameter, typically 0.1 to 0.3 mm; preferred solder ball diameter is 0.2 mm. Several methods are available to achieve consistency of geometrical shape by controlling amount of material and uniformity of reflow temperature. The materials are usually alloys of lead, tin and sometimes indium or silver; dependent on the composition, the reflow temperature is commonly in the range from about 150 to 260° C.

The overall outline and profile of the device 100 in FIG. 1 puts it into the chip-scale category. A true chip-size device with thin profile, such as the device generally designated 300 in FIG. 3, can be manufactured according to the teachings of the present invention including the same processes as discussed in detail above in FIGS. 1 and 2. For this embodiment, it is advantageous to employ wafer-scale assembly, i.e. apply the process steps of the invention to the whole semiconductor wafer rather than to individual chips.

A whole semiconductor wafer is processed which has on its active surface a plurality of integrated circuits protected by a polymer layer. In each circuit, windows are opened into the polymer layer to expose the circuit bonding pads. The polymer layer is activated by the processes described in conjunction with FIGS. 1 and 2. A sheet of electrically insulating substrate, large enough to cover the whole wafer, is placed with its second surface over the wafer. The substrate has a plurality of contact pads on its first surface and is integral with a plurality of electrically conductive routing strips. The second surface of the substrate is contacted to the preactivated polymer layer over the wafer. Strong adhesion is exerted at the interface between the preactivated layer and the substrate sheet. The substrate sheet is directly attached to the wafer. If necessary, additional heating and pressure may be applied as described above.

Next, conventional wire bonding establishes the electrical connection between each bonding pad of each circuit to the respective contact pads on the substrate. The bonding wires are then protected by encapsulating material, which is either applied using a transfer molding process or a potting process. The encapsulation material is polymerized in a curing step. In the last step of the process flow, the composite structure is separated into discreet devices. Usually, high-speed sawing along the sawing lines of the semiconductor wafer is employed to singulate the integrated circuits from the wafer.

Figure 3:
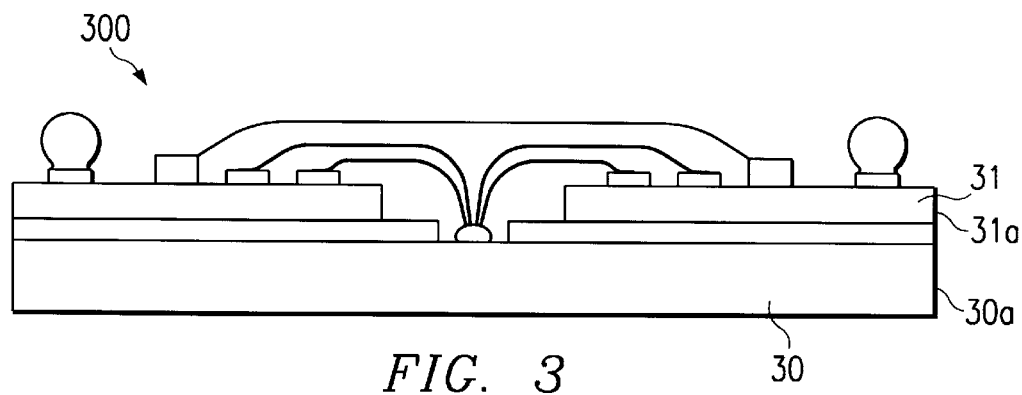
FIG. 3 is a simplified and schematic cross section of a semiconductor chip directly attached to a substrate, forming a chip-size package, according to another embodiment of the invention.
Figure 4:
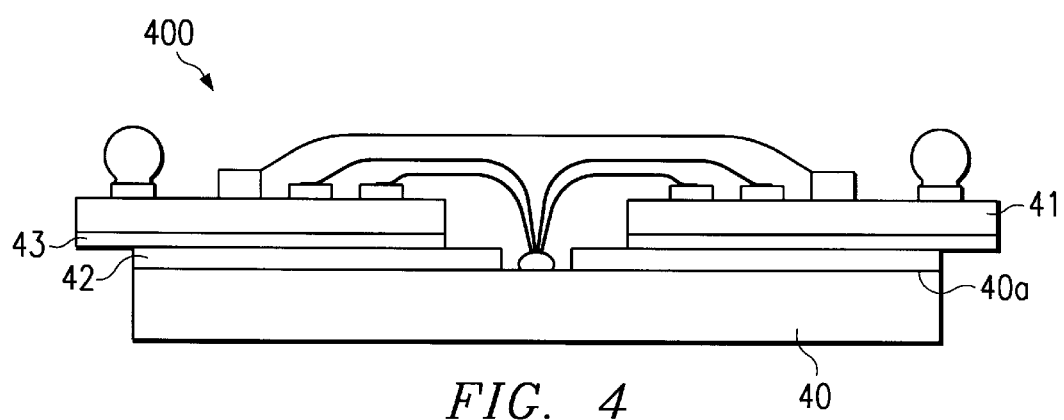
FIG. 4 is a simplified and schematic cross section of a semiconductor chip attached to a substrate with a metal layer disposed on the substrate, according to another embodiment of the present invention.

As a result, the outline of the chip 30 in FIG. 3 determines the size of the package of device 300. The sawing lines 30a of chip 30 continue into the sawing lines 31a of substrate 31. Device 300 is an exact chip-size package.

Figure 5:
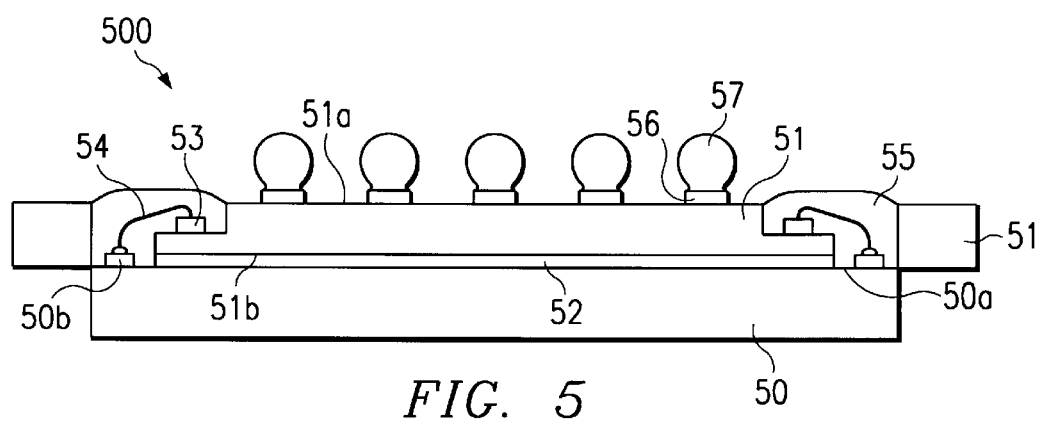
FIG. 5 is a simplified and schematic cross section of a semiconductor chip directly attached to a substrate with a modified bonding wire configuration according to another embodiment of the present invention.

FIG. 5 depicts the schematic and simplified cross section through another embodiment of the present invention. Device 500 has a chip 50 with an active surface 50a including the integrated circuit. The plurality of bonding pads 50b of this integrated circuit is disposed around the periphery of the chip. Consequently, the plurality of contact pads 53 on the first surface 51a of substrate 51 is also disposed around the periphery of the substrate. The bonding pads are electrically connected to the respective contact pads by bonding wires 54. The wires are protected by encapsulation material 55. The plurality of solder balls 57 is attached to the metallization pads 56, also disposed on the first surface 51a of substrate 51. In this device design, the solder balls can be located in the center portion of the device, where thermomechanical stress in the solder joints is minimized.

The second surface 51b of substrate 51 is attached to the polymer layer 52 protecting chip 50. This polymer layer 52 is activated according to the method of the present invention by exposing it to reactive ion etching plasma (preferably CF4/O2 plasma). By the process described in conjunction with FIGS. 1 and 2, the polymer surface roughness is increased and affinity to adhesion is imparted (breaking of chemical bonds of organic molecules and creating molecular radicals comprising chemically unsaturated bonds).

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for attaching an integrated circuit chip to an organic substrate comprising the steps of:
    providing an integrated circuit chip having an active and a passive surface, said active surface including a protective polymer layer;
    activating said polymer layer by exposing it to a fluorocarbon reactive ion etching plasma, thereby increasing the surface roughness and imparting affinity to adhesion;
    providing an electrically insulating substrate having first and second surfaces; and
    directly contacting said second surface of said substrate to said activated polymer layer on said chip, without adhesive, whereby strong adhesion is exerted at the interface between said layer and said substrate, directly attaching said substrate to said chip.

2. The method according to claim 1 wherein said plasma is a CF4/O2 plasma.

3. The method according to claim 1 wherein said plasma has an energy sufficient to brake C—N bonds in the polymer layer.

4. The method according to claim 1 wherein said plasma has an energy of approximately 70 kcal/mol.

5. The method according to claim 1 wherein said affinity to adhesion is imparted by breaking chemical bonds of organic molecules and creating molecular radicals comprising chemically unsaturated bonds.

6. The method according to claim 1 wherein the step of contacting said substrate to said activated polymer layer on said chip further includes the step of applying heat to said substrate and said polymer layer on said chip.

7. The method according to claim 6 wherein the step of applying heat to the chip is further defined as applying heat at a temperature between about 150 and 350° C.

8. The method according to claim 1 further comprising the step of applying force between said substrate and said polymer layer.

9. The method according to claim 8 wherein the step of applying force is further defined as applying a force to said chip of between about 5 to 7 kg.

10. The method according to claim 8 wherein the step of applying force is further defined as applying force for a period of between about 2 and 10 s.

11. The method according to claim 1 wherein a metal layer is disposed on said second surface of said substrate prior to attaching said second surface to said activated polymer layer on said chip.

12. The method according to claim 11 wherein the step of contacting said metal layer disposed on said substrate to said activated polymer layer on said chip further includes the step of applying heat to said substrate and said polymer layer on said chip.

13. The method according to claim 12 wherein the step of applying heat to the chip is further defined as applying heat at a temperature between about 150 and 350° C.

14. The method according to claim 1 further comprising the step of applying force between said substrate and said polymer layer.

15. The method according to claim 14 wherein the step of applying force is further defined as applying a force to said chip of between about 1.5 to 7.0 kg.

16. The method according to claim 14 wherein the step of applying force is further defined as applying force for a period of between 2 and 10 s.

17. A method for attaching an integrated circuit wafer to an organic substrate comprising the steps of:
    providing a semiconductor wafer having an active and a passive surface, said active surface including a plurality of integrated circuits, each having bonding pads and a protective polymer layer;
    activating said polymer layer of each circuit by exposing said wafer to reactive ion etching plasma containing a fluorocarbon, thereby increasing the surface roughness and imparting affinity to adhesion;
    providing an electrically insulating substrate having first and second surfaces, including a plurality of contact pads disposed on said first surface;
    directly contacting said second surface of said substrate to said activated polymer layer on said wafer, without adhesive, whereby strong adhesion is exerted at the interface between said layer and said substrate, directly attaching said substrate to said wafer;
    wire bonding said circuit bonding pads to said substrate contact pads, respectively;
    protecting said bonding wires by encapsulation material; and
    separating the resulting composite structure into discreet devices.

18. A method for making a packaged integrated circuit device, comprising the steps of:
    providing an integrated circuit chip, said chip including a polymer protective layer;
    subjecting said polymer protective layer to a fluorocarbon reactive ion etching environment;
    providing an organic substrate; and
    mounting said chip to said substrate, such that said chip and said substrate are contiguous.

19. The method of claim 18, wherein said step of mounting said chip to said substrate comprises heating said substrate and said chip.

* * * * *